(12) United States Patent
Zumkehr

(10) Patent No.: US 6,456,544 B1
(45) Date of Patent: Sep. 24, 2002

(54) SELECTIVE FORWARDING OF A STROBE BASED ON A PREDETERMINED DELAY FOLLOWING A MEMORY READ COMMAND

(75) Inventor: John F. Zumkehr, Orange, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,533

(22) Filed: Mar. 30, 2001

(51) Int. Cl.[7] .................................................. G11C 7/00
(52) U.S. Cl. ...................... 365/193; 365/194; 365/233.5
(58) Field of Search ................................. 365/193, 194, 365/233.5, 189.05, 230.08, 233; 711/167

(56) References Cited

U.S. PATENT DOCUMENTS 5,488,581 A * 1/1996 Nagao et al. .......... 365/189.05
5,812,492 A * 9/1998 Yamauchi et al. ........ 365/233.5
6,112,284 A * 8/2000 Hayek et al. ................ 711/167

* cited by examiner

*Primary Examiner*—David Lam
(74) *Attorney, Agent, or Firm*—Blakely, Sokoloff, Taylor & Zafman LLP

(57) ABSTRACT

A method for reading data from a memory device, according to an embodiment of the invention, is disclosed. A strobe signal from the memory device is not forwarded by a controller until after a predetermined time interval following the sending of a read command by the controller to the memory device. A first bit value is captured, according to the forwarded strobe signal, in a data signal also from the memory device. The predetermined time interval is at least as long as a roundtrip flight time interval of a reference pulse that is transmitted from the controller to the memory device and back to the controller.

30 Claims, 6 Drawing Sheets

SELECTIVE FORWARDING OF A STROBE BASED ON A PREDETERMINED DELAY FOLLOWING A MEMORY READ COMMAND

BACKGROUND

This invention is generally related to digital solid state memories and more particularly to source synchronous input/output (I/O) in a memory subsystem where the strobe signal is either asserted, deasserted, or not driven by a memory device.

In a memory subsystem that operates in a source synchronous manner, the device which transmits a data signal on a conductive data line also transmits a strobe signal on a separate conductive line. A pulse in the strobe signal has a predefined phase relationship to each associated pulse in a number of data signals. The pulse in the strobe signal is used to capture bit values in the data signals at the receiving device. This is done by running the data and strobe signals through receiver circuitry which detects the logic levels that are being asserted, and translates them into voltage levels that are suitable for processing by controller circuitry in an integrated circuit (IC) die. The outputs of the receiver circuitry are then fed to a number of latches each of which captures a bit value in a respective data signal in response to a pulse in the strobe signal.

According to certain high speed signaling requirements, the strobe receiver circuit at its front end should have a two input comparator, where each input is terminated at the same termination voltage, which may be half-way between a logic '0' voltage and a logic '1' voltage. The strobe line coming from the memory device is shorted to one of the inputs. The comparator's output at any time indicates the logic state being detected on the strobe line, as either '0' or '1' depending upon whether the strobe signal is being asserted or deasserted by the memory device. The output of the comparator directly feeds the clock input of a latch. A data input of the latch receives a level-translated version of the data signal. The latch thus captures a bit value in the data signal upon every low/high to high/low transition of the comparator output. In other words, the latched bit values are always dictated by the strobe signal. The latter is also referred to here as 'continuously forwarding' the strobe signal.

In some high speed memory specifications such as double data rate (DDR) synchronous dynamic random access memory (SDRAM), as defined by the Joint Electronic Device Engineering Council (JEDEC) Solid State Technology Association in their publication, *DDR SDRAM Specification (JESD79)*, June 2000, a memory device must neither assert or deassert the strobe signal when it is not providing any data in response to a read command. In other words, when no read data is being transferred, the memory device should not drive the strobe line to a '0' or '1' voltage. This, however, causes a problem at the receiving device when the strobe line floats to the termination voltage, thereby causing the comparator output to become unstable due to the now essentially equal input voltages. This instability in turn will cause the unacceptable result that unintended bit values are captured by the latch from the data line.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

According to the various embodiments of the invention described below, the controller reads data from a memory device by selectively forwarding the strobe signal, rather than continuously forwarding the strobe signal. The strobe signal is not forwarded until after a predetermined time interval has lapsed following the sending of a read command by the controller to the memory device. A bit value is captured, according to the forwarded strobe signal, in the data signal from the memory device.

The predetermined value is selected such that no unintended bit values are captured by the controller when the strobe line is not being driven by the memory device. In an embodiment of the invention, the predetermined time interval is selected to be at least as long as a roundtrip flight time interval between the controller and the memory device, plus a memory read latency interval of the memory device. In addition to avoiding the capture of unintended bit values, a further advantage to such a scheme is that only the controller needs to be modified to have the ability to determine this predetermined time interval, such that the design and operation of existing memory devices need not be altered. As will be described below, the various embodiments of the invention allow the controller to "know" when each memory device will be driving the strobe signal during a read operation, so that the receiver is not enabled until just before the strobe is asserted.

Figure 1:
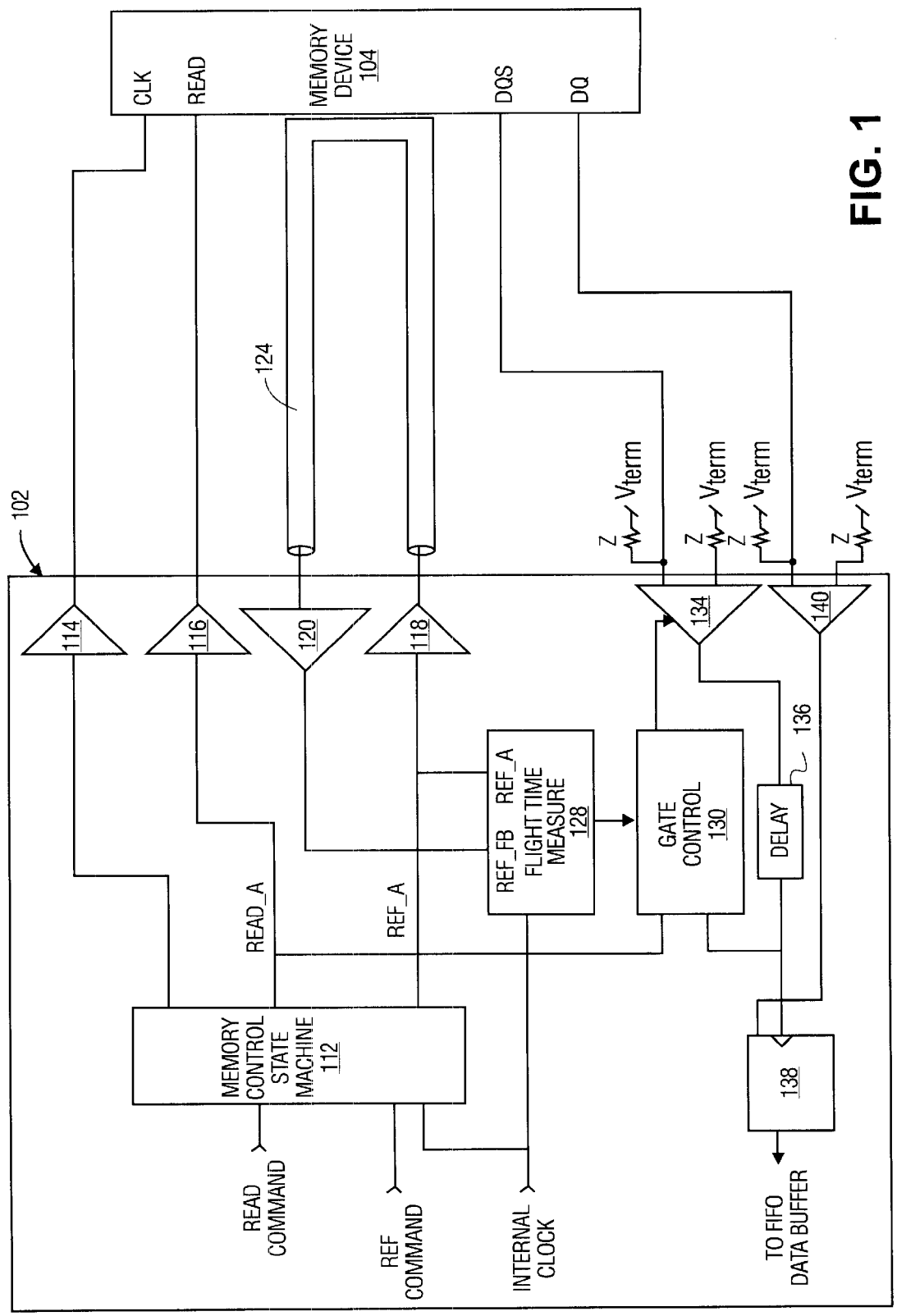
FIG. 1 shows a block diagram of a memory subsystem configured according to an embodiment of the invention.

FIG. 1 illustrates a memory subsystem designed according to an embodiment of the invention. The system features a controller 102 that is coupled to a memory device 104. The memory device 104 may be a single IC die that includes an array of volatile storage cells which can be randomly accessed by a read command received from the controller 102. The controller 102 may be part of a separate memory controller IC die, a memory repeater hub IC die, or a processor die. Communication between the controller 102 and the memory device 104 is via a parallel bus on which a READ signal, a clock (CLK) signal, a strobe (DQS) signal, and a data (DQ) signal are transmitted. There may be multiple data signals in which bit values are captured according to a single strobe signal, although for purposes of conciseness only one data signal is illustrated here.

The interface in the controller 102 to the conductive lines which form the bus between the controller 102 and the memory device 104 includes a number of receivers 120, 134, and 140, and a number of drivers 114, 116, and 118.

Each of these serves to translate between the signaling levels on the bus and those in the controller's IC die. The receiver 134 has two inputs both of which, in one embodiment, are terminated at the same voltage Vterm through the same termination impedance Z. This equal termination scheme helps avoid distorting the duty cycle of the received strobe signal and the resulting output signal of the receiver 134. The receiver 134 is gated in that a control input which receives a control signal from gate control circuit 130 is provided to selectively forward the strobe signal. The output of the gated receiver 134 is fed to the clock input of a latch 138 via a delay block 136. The delaying of the forwarded strobe signal in this manner allows the latch 138 to capture the bit value in the data signal in a more reliable manner by moving the latch clock to approximately the middle of the bit valid data window.

When the gated receiver 134 is disabled, its output is driven to a predetermined logic state and stays at that logic state, until the receiver is again enabled so that the strobe signal may be forwarded. By keeping the output of the receiver 134 at a fixed, predetermined logic state, latch 138 receives no edges at its clock input and therefore does not capture any bit values in the data signal.

The gate control circuit 130 features a delay circuit to provide a delay of a predetermined time interval to a memory read command. In the embodiment shown in FIG. 1, this read command is sent to a memory control state machine 112 to yield the READ_A signal. The output of the gated receiver is enabled, in this embodiment, when READ_A, after being delayed by the predetermined interval, reaches the gated receiver 134.

The controller 102 also features time interval measurement circuitry that is designed to determine a value representative of a roundtrip flight time interval of a pulse that is sent from the controller 102 to the memory device 104 and back to the controller 102. An embodiment of such a circuit is the flight time measure circuit 128. In one embodiment, the flight time measure circuit 128 determines the time interval between pulses being asserted at two inputs labeled REF_A and REF_FB. The controller 102 is to send a reference pulse through the driver 118 and receive a return pulse through receiver 120. This reference pulse may, if desired, be phase aligned to the internal clock of the controller 102.

The physical path of this reference pulse, where the physical path may be implemented by a single conductive line 124 as in this example, should emulate the paths of the READ and the DQS (strobe) signals that are being sent between the controller and the memory device 104. In one embodiment, the conductive line 124 forms a conductive loop. However, an alternative would be to terminate the loop physically near the memory device 104 with either passive or active components if doing so would better emulate the path of the READ and DQS signals. In addition, the receiver 120 and driver 118 should also emulate the receiver 134 on the DQS line and driver 116 on the READ line, to help match as closely as possible the time delay experienced by the transmission of the READ signal and receipt of the DQS signal.

The actual measurement of the time interval by the flight time measure circuit 128 may be performed according to a wide range of well known techniques for measuring the time that lapses between two pulses. For instance, a timer could start counting upon a rising edge of REF_A, where the count is incremented in accordance with the edges of the internal clock, and to stop counting upon a rising edge of REF_FB. This means that the accuracy or granularity of the roundtrip flight time that is being measured is a function of the frequency of the internal clock, such that if the internal clock has a relatively high frequency, then the granularity of the roundtrip flight time measurement is also finer. An alternative to using the internal clock as a time base would be to use a separate, higher speed clock just for making the roundtrip flight time measurement. In both cases, once the roundtrip flight time interval has been measured, by the circuit 128, this information is passed on to the gate control circuit 130 which provides a delay of a predetermined time interval that is at least as long as the measured roundtrip flight time interval.

Returning briefly to the memory control state machine 112, this unit serves to generate READ_A and REF_A and CLK, using the highly stable and accurate internal clock as a base timing signal.

Figure 2:
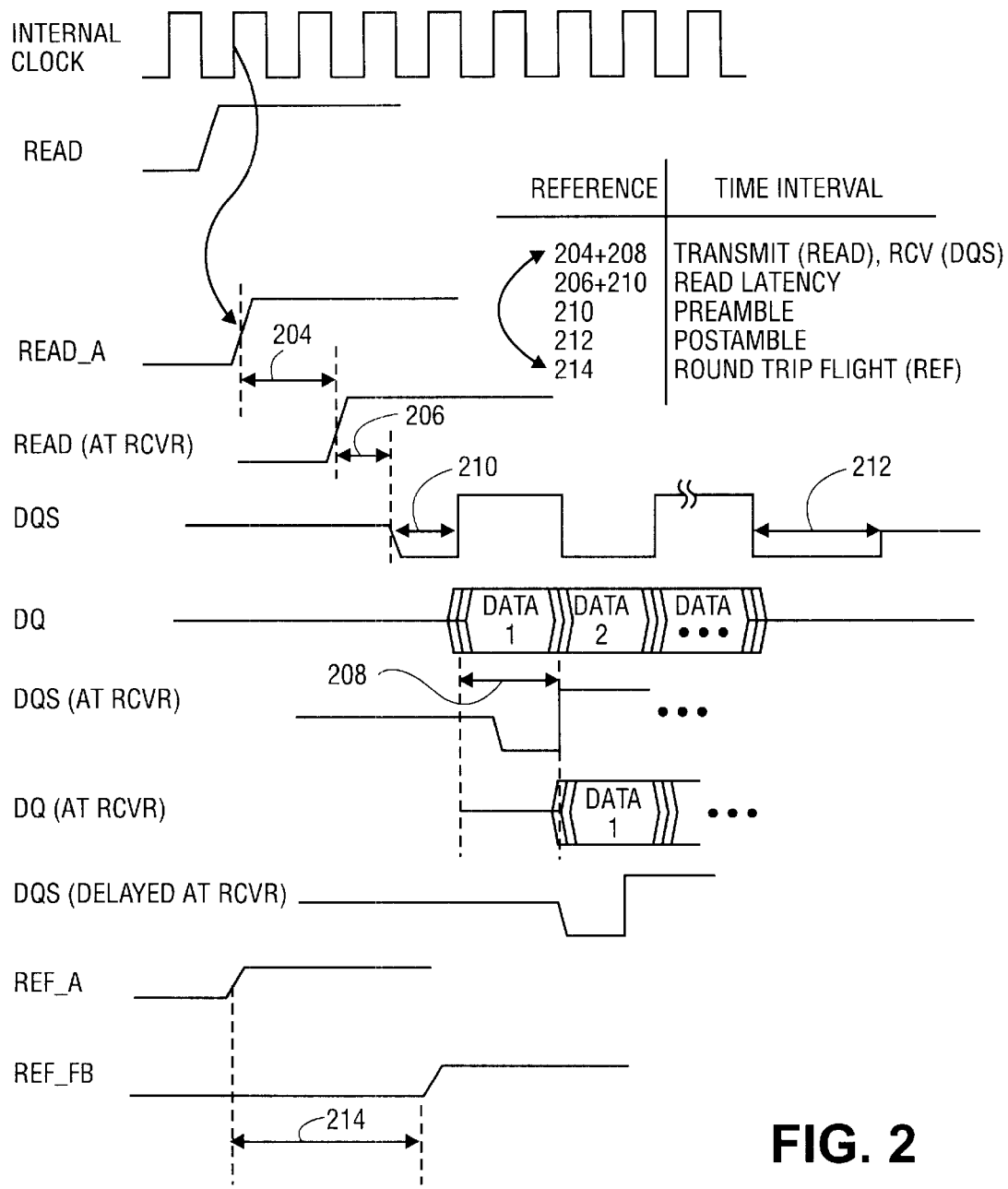
FIG. 2 illustrates a timing diagram of signals found in an exemplary implementation of the memory subsystem.

Referring now to FIG. 2, what's shown is a timing diagram of various signals in the system of FIG. 1 to illustrate operation of the system. At the top of the timing diagrams, a READ command is latched according to a rising edge of the internal clock. This is done by the memory control state machine 112 which generates the READ_A signal. This signal is then translated into the READ signal by the driver 116 and transmitted from the controller 102 to the memory device 104. The READ signal is received at the memory device 104 after a flight time interval 204. Meanwhile, the DQS and DQ signals are not yet being driven by the memory device 104.

Following a read latency interval that is composed of an initial interval 206 (that could, for instance, be the column address strobe (CAS) latency) and a subsequent interval 210, the DQS signal is asserted by the memory device 104 in response to receiving the READ signal. The interval 210 which immediately precedes the assertion of DQS is known as the preamble. The preamble interval 210 is specified by the JEDEC DDR standard mentioned above to allow the system to tolerate some variation in the timing of the I/O signals between the memory device and the controller. At the end of the preamble interval, DQS is asserted at the same time as the first bit value is asserted on the DQ line.

In the embodiment shown in FIG. 2, the protocol for the DQS and DQ signals allows a bit value to be asserted simultaneous with each rising or falling edge of DQS. Thus, the bit values 1, 2, . . . are available starting at alternate rising and falling edges of DQS. After the last bit value has been asserted, a time interval 212 known as the postamble follows the last falling edge of DQS. Thereafter, the DQS line is returned to its non-driven state as shown. It should be noted that the invention may also be used with a protocol in which only the rising or falling edge, and not both, of DQS are used to mark the associated bit values.

The DQS and DQ pulses are received at the controller 102 following a DQS/DQ flight time interval 208. The received DQS is further delayed at the controller, such that its rising or falling edge is positioned closer to the middle of its associated data pulse, for more reliable data capture. This small delay is accomplished by the delay block 136 (see FIG. 1).

Figure 3:
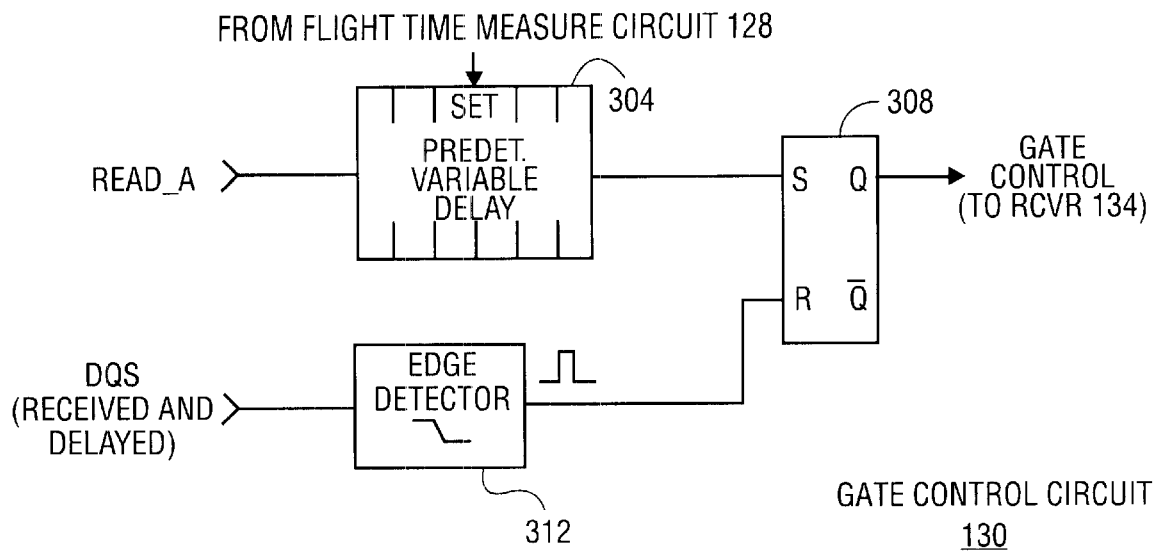
FIG. 3 depicts a block diagram of an exemplary implementation of the gate control circuitry used in the memory subsystem.

The last two waveforms in FIG. 2 are the reference and feedback reference signals REF_A and REF_FB, respectively. The roundtrip flight time interval 214 for the reference signal should be, in one embodiment, approximately the same as the transmit and receive intervals for the READ and DQS signals, that is the sum of intervals 204 and 208. Armed with a knowledge of this roundtrip flight time interval 214, as well as the read latency interval (interval 206 plus preamble interval 210), the designer of the controller 102 will be able to design the gate control circuit 130 (see FIG. 1) such that READ_A is subjected to the correct time delay. FIG. 3 shows a particular implementation of the gate control circuit 130 that subjects the READ_A signal to this predetermined delay.

Figure 4:
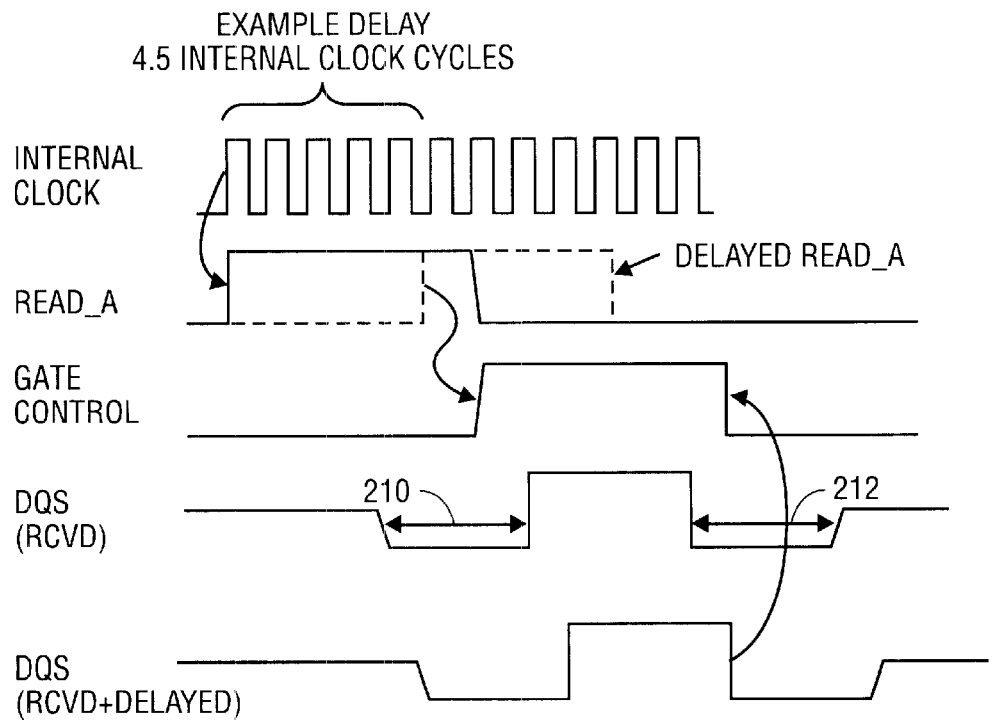
FIG. 4 depicts a timing diagram of signals in the gate control circuitry of FIG. 3.

In FIG. 3, the gate control circuit 130 features a predetermined variable delay element 304 which provides a programmed delay to an input READ_A signal. The output of the delay block 304 is fed to the S input of a S-R flip-flop 308 whose output is the gate control signal provided to the gated receiver 134 (see FIG. 1). For the embodiment of the invention whose operation is illustrated using the timing diagram of FIG. 2, the total predetermined delay to which READ_A is subjected in FIG. 3 includes at least the roundtrip flight time interval of the reference pulse, plus the memory read latency which includes interval 206 and a substantial portion of the preamble time interval 210 (see FIG. 2). In this manner, the output of the predetermined variable delay block 304 is asserted at a point in time which is within the preamble 210 but substantially before the end of the preamble 210, as shown in the timing diagram of FIG. 4. This may be considered an optimal point in time at which to enable the receiver 134 so as to forward the strobe signal.

The disabling of the receiver 134 is accomplished, in this embodiment, by resetting the output of the S-R flip-flop 308 by clocking a pulse at the R input of the flop 308. This pulse is asserted by an edge detector 312 in response to detecting a falling edge of a delayed version of the received DQS signal. Referring to the timing diagram of FIG. 4, it is clear that the gate control circuit asserts the gate control output in this embodiment substantially in the middle of the preamble interval 210 and deasserts that signal approximately in the middle of the postamble interval 212 which follows the last falling edge of the received DQS signal.

Figure 5:
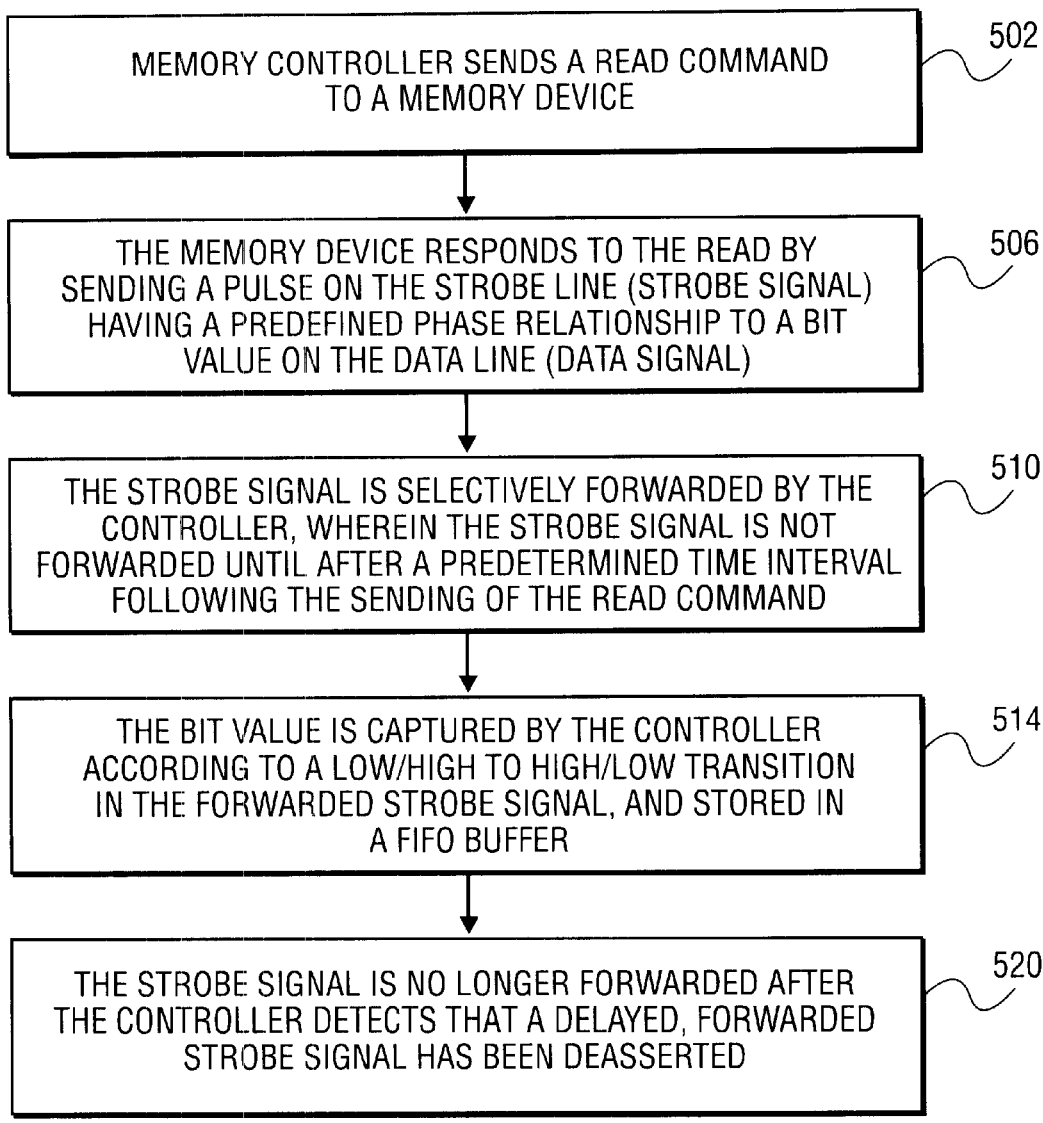
FIG. 5 shows a flow diagram of operations performed in reading data from a memory device, according to an embodiment of the invention.

Referring now to FIG. 5, what's shown is a flow diagram of an embodiment of the invention for reading from a memory device. Beginning with block 502, a controller sends a read command to a memory device over a parallel bus. The memory device responds to the read by sending a pulse on a strobe line (the strobe signal). This pulse has a pre-defined phase relationship to a bit value that is asserted on the data line (block 506). The strobe signal is selectively forwarded by the controller, wherein the strobe signal is not forwarded until after a predetermined time interval following the sending of the read command (block 510). The bit values are captured by the controller according to a low/high to high/low transition in the forwarded strobe signal. These captured bit values are then stored in a first-in first-out (FIFO) buffer (block 514). The strobe signal is no longer forwarded after the controller detects that a delayed, forwarded strobe signal has been deasserted (block 520).

Figure 6:
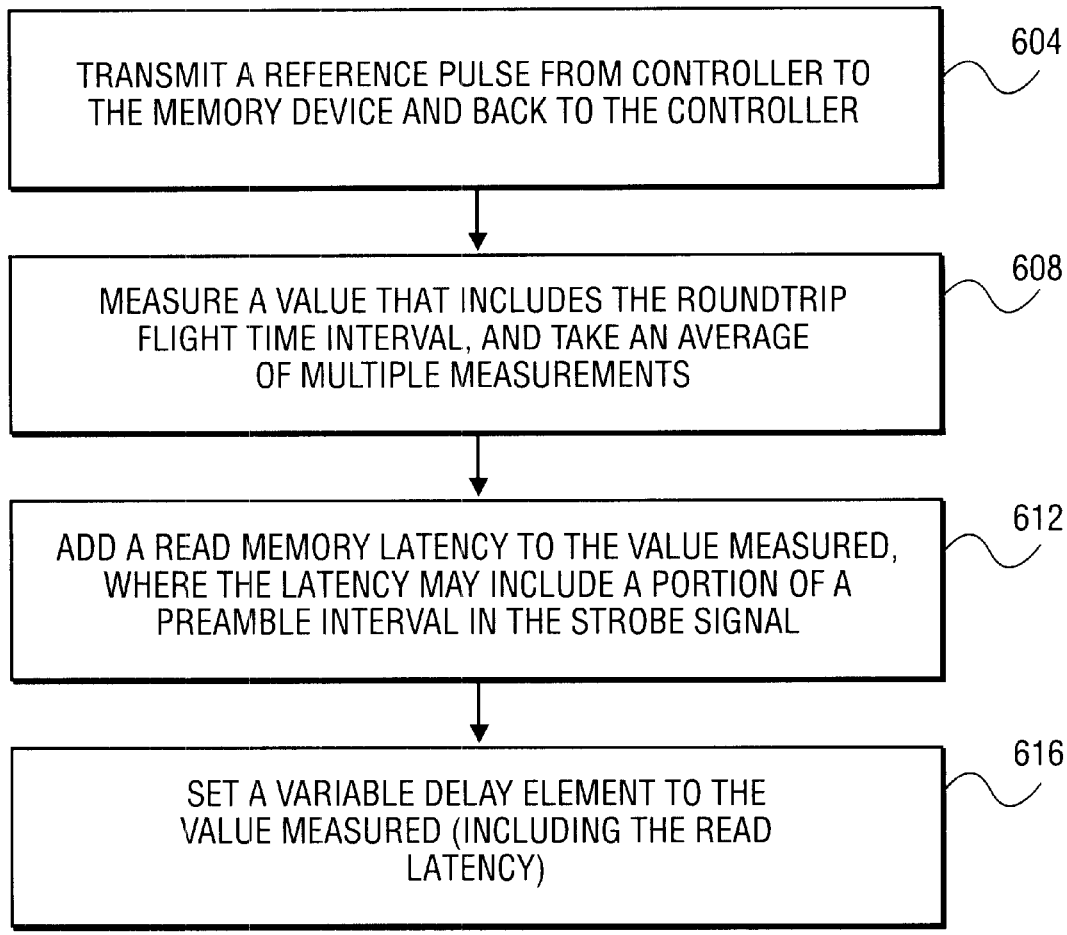
FIG. 6 depicts a flow diagram of operations performed by the controller in determining a roundtrip flight interval between the controller and the memory device.

An exemplary technique for determining a roundtrip flight time of a pulse that is transmitted between the controller and the memory is depicted in FIG. 6. As mentioned above, the predetermined time interval that is used for determining when to forward the strobe signal is at least as long as this roundtrip flight time. Referring now to FIG. 6, a reference pulse is transmitted from the controller to the memory device and back to the controller (block 604). Thereafter, a value that includes the roundtrip flight time interval of the pulse is measured by the controller (block 608). There may be multiple measurements taken, such that the final value that is accepted may be an average of multiple measurements taken. Operation then proceeds with adding a read memory latency to the measured value, where this latency may include a portion of a preamble interval in the strobe signal if the signaling protocol provides for such a preamble (block 612). The precise amount of latency to be added depends upon the particular memory devices that are to be used with the controller as well as the length of the preamble interval specified in the signaling protocol. The value now represents the predetermined time interval which will be programmed into a programmable delay element (block 616).

The actual delay that is presented by this delay element may have a resolution equal to a single or one half of the period of the internal clock of the controller 102. However, higher or lower resolutions may be obtained depending upon the complexity of the circuitry that can be tolerated for the variable delay element. After setting the delay element, the controller 102 is now ready for the selective forwarding of the strobe signal in response to each assertion of the read command to the memory device.

Figure 7:
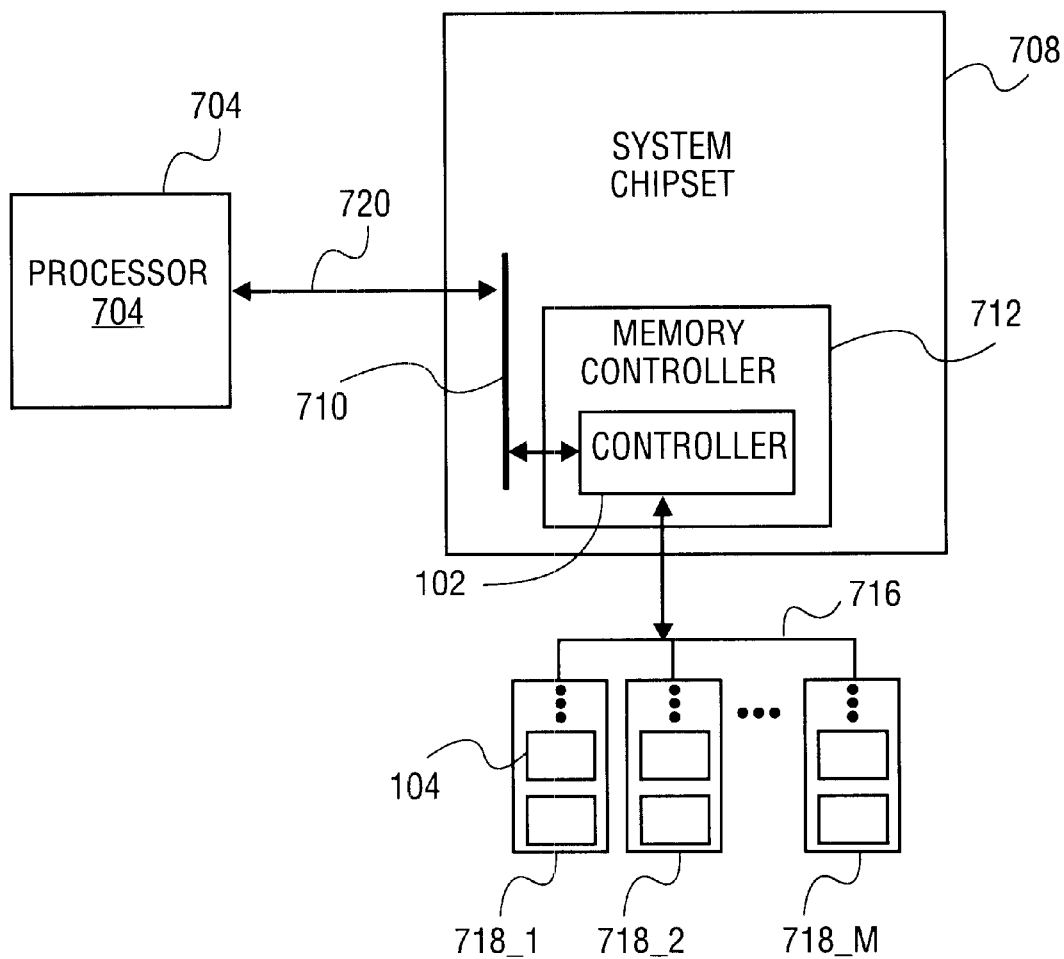
FIG. 7 shows a system application of the controller.

Referring now to FIG. 7, what's shown is a system application of the controller 102, according to another embodiment of the invention. The electrical system features a processor 704 that communicates with a system chipset 708. The system chipset 708 has a bus 710 to which a memory controller 712 is communicatively coupled. A number of memory modules 718_1, 718_2, ... 718_M provide volatile storage, for instance for storing program memory, in the system. Each memory module 718 includes a number of memory devices 104 each of which communicates with the controller 102 according to the above described memory read methodologies. In some embodiments, each memory module 718 is a separate printed wiring board that is plugged into a slot of a memory bus 716. The memory bus 716 is embedded into a printed wiring board which also includes the conductive lines of a processor bus 720 that connects the processor 704 to the system chipset 708. Thus, the printed wiring board which contains the entire system shown in FIG. 7 is a motherboard of a computing device. The interface between the processor 704 and the memory modules 718 is an embodiment of the controller 102 which is actually part of memory controller 712. The memory controller 712 serves to, for instance, translate between virtual and physical memory addresses as well as a host of other memory management tasks that are well known to those of ordinary skill in the art. The system may also feature peripheral devices that are not shown, such as a mouse or keyboard, a display monitor, and an interface to a computer network. The system may thus be for instance a desktop or portable computer or other portable electronic information processing device.

To summarize, various embodiments of a controller and a method for reading data from a memory device have been illustrated. In the foregoing specification, the invention has been described with reference to specific exemplary embodiments thereof. It will, however, be evident that various modifications and changes may be made thereto without departing from the broader spirit and scope of the invention as set forth in the appended claims. For instance, the means for selectively forwarding the strobe signal, capturing the bit value in the data signal, and controlling the selective forwarding may be accomplished not just using the gated receiver 134, latch 138, and gate control circuit 130, but also using other means that can be developed by those of ordinary skill in the art to perform their respective functionalities. This also applies to the means for determining the roundtrip flight time interval as well, where one embodiment described above involved the use of a timer to detect a reference pulse that is 'bounced' off the memory device. The specification and drawings are, accordingly, to be regarded in an illustrative rather than a restrictive sense.

What is claimed is:

1. A controller comprising:
   means for selectively forwarding a strobe signal from a memory device;
   means for capturing a first bit value, according to the forwarded strobe signal, in a data signal from the memory device;
   means for controlling the selectively forwarding means so that the strobe signal is not forwarded until after a predetermined time interval following a read command to the memory device; and
   means for determining a value representative of a roundtrip flight time interval of a reference pulse sent from the controller to the memory device and back to the controller, wherein the predetermined time interval is at least as long as the roundtrip time interval.

2. The controller of claim 1 wherein the predetermined time interval is at least as long as the roundtrip time interval plus a memory read latency interval of the memory device.

3. The controller of claim 2 wherein the memory read latency interval is at least as long as a substantial portion of a preamble time interval, and wherein the strobe signal is (1) deasserted by the memory device during each preamble time interval that immediately precedes each asserted pulse in the strobe signal, and (2) neither asserted or deasserted by the memory device prior to each preamble time interval in the strobe signal.

4. The controller of claim 1 further comprising:
   means for delaying the forwarded strobe signal and being coupled to the capture means so that the bit value is captured according to the delayed forwarded strobe signal.

5. The controller of claim 4 wherein the control means is further coupled to the delay means to further control the selectively forwarding means so that the strobe signal is no longer forwarded after detecting that the delayed forwarded strobe signal has been deasserted.

6. The controller of claim 1 wherein the capture means is to further capture a second bit value, according to the forwarded strobe signal, in the data signal from the memory device, wherein the first bit value is to be captured in response to a low/high to high/low transition of a pulse in the forwarded strobe signal and the second bit value is to be captured in response to a high/low to low/high transition of the pulse.

7. A method for reading data from a memory device, comprising:
   forwarding a strobe signal, wherein the strobe signal is not forwarded until after a predetermined time interval following a read command to the memory device;
   capturing a first bit value, according to the forwarded strobe signal, in a data signal from the memory device; and
   transmitting a reference pulse from a controller to the memory device and back to the controller, and measuring a value that includes the roundtrip flight time interval of the pulse, wherein the predetermined time interval is at least as long as the roundtrip time interval.

8. The method of claim 7 wherein the predetermined time interval is at least as long as the roundtrip time interval plus a memory read latency interval of the memory device.

9. The method of claim 8 wherein the memory read latency interval is at least as long as a substantial portion of a preamble time interval, wherein the strobe signal is (1) deasserted during each preamble time interval that immediately precedes each asserted pulse in the strobe signal, and (2) neither asserted or deasserted prior to each preamble time interval in the strobe signal.

10. The method of claim 7 further comprising:
    delaying the forwarded strobe signal so that the bit value is captured according to the delayed forwarded strobe signal.

11. The method of claim 10 further comprising:
    no longer forwarding the strobe signal after detecting that the delayed forwarded strobe signal has been deasserted.

12. A controller comprising:
    a gated receiver having an output to forward a strobe signal from a memory device, wherein the output goes to a predetermined logic state when the strobe signal is not being forwarded;
    a latch circuit having a clock input coupled to the output of the gated receiver and a data input to capture a first bit value in a data signal from the memory device; and
    a delay circuit to provide a delay of a predetermined time interval to a memory read command, the delay circuit having an output coupled to a control input of the gated receiver to enable the output of the receiver.

13. The controller of claim 12 further comprising:
    a time interval measurement circuit coupled to determine a value representative of a roundtrip flight time interval of a reference pulse sent from the controller to the memory device and back to the controller, the time interval measurement circuit being further coupled to the delay circuit so that the predetermined time interval is at least as long as the roundtrip flight time interval.

14. The controller of claim 13 wherein the predetermined time interval is at least as long as the roundtrip time interval plus a memory read latency interval of the memory device.

15. The controller of claim 14 wherein the memory read latency interval is at least as long as a substantial portion of a preamble time interval, wherein the strobe signal is (1) deasserted during each preamble time interval that immediately precedes each asserted pulse in the strobe signal, and (2) neither asserted or deasserted prior to each preamble time interval in the strobe signal.

16. The controller of claim 12 further comprising:
    a delay block having an input coupled to the output of the gated receiver and an output coupled to the clock input of the latch circuit.

17. The controller of claim 16 further comprising:
    an edge detector having an input coupled to an output of the delay block and, an output coupled to the control input of the gated receiver to disable the output of the gated receiver.

18. An electrical system comprising:
    a printed wiring board on which a processor and a system chipset are installed, the system chipset includes a memory controller which allows communication between the processor and a number of memory modules installed in a memory bus of the printed wiring board, each memory module having a memory device that can be accessed by the processor, wherein the memory controller further includes a gated receiver having an output to forward a strobe signal from the memory device, wherein the output goes to a predetermined logic state when the strobe signal is not being forwarded, a latch circuit having a clock input coupled to the output of the gated receiver and a data input coupled to capture a first bit value in a data signal from the memory device, and a delay circuit to provide a delay of a predetermined time interval to a memory read command, the delay circuit having an output coupled to a control input of the gated receiver to enable the output of the receiver.

19. The electrical system of claim 18 wherein the memory controller further comprises:

a time interval measurement circuit coupled to determine a value representative of a roundtrip flight time interval of a reference pulse sent from the controller to the memory device and back to the controller, the time interval measurement circuit being further coupled to the delay circuit so that the predetermined time interval is at least as long as the roundtrip flight time interval.

20. The electrical system of claim 19 wherein the predetermined time interval is at least as long as the roundtrip time interval plus a memory read latency interval of the memory device.

21. The electrical system of claim 20 wherein the memory read latency interval is at least as long as a substantial portion of a preamble time interval, wherein the strobe signal is (1) deasserted during each preamble time interval that immediately precedes each asserted pulse in the strobe signal, and (2) neither asserted or deasserted prior to each preamble time interval in the strobe signal.

22. A controller comprising:

means for selectively forwarding a strobe signal from a memory device;

means for capturing a first bit value, according to the forwarded strobe signal, in a data signal from the memory device;

means for controlling the selectively forwarding means so that the strobe signal is not forwarded until after a predetermined time interval following a read command to the memory device; and means for delaying the forwarded strobe signal and being coupled to the capture means so that the bit value is captured according to the delayed forwarded strobe signal, wherein the control means is further coupled to the delay means to further control the selectively forwarding means so that the strobe signal is no longer forwarded after detecting that the delayed forwarded strobe signal has been deasserted.

23. The controller of claim 22 further comprising:

means for determining a value representative of a roundtrip flight time interval of a reference pulse sent from the controller to the memory device and back to the controller, wherein the predetermined time interval is at least as long as the roundtrip time interval.

24. The controller of claim 23 wherein the predetermined time interval is at least as long as the roundtrip time interval plus a memory read latency interval of the memory device.

25. The controller of claim 24 wherein the memory read latency interval is at least as long as a substantial portion of a preamble time interval, and wherein the strobe signal is (1) deasserted by the memory device during each preamble time interval that immediately precedes each asserted pulse in the strobe signal, and (2) neither asserted or deasserted by the memory device prior to each preamble time interval in the strobe signal.

26. The controller of claim 22 wherein the capture means is to further capture a second bit value, according to the forwarded strobe signal, in the data signal from the memory device, wherein the first bit value is to be captured in response to a low/high to high/low transition of a pulse in the forwarded strobe signal and the second bit value is to be captured in response to a high/low to low/high transition of the pulse.

27. A method for reading data from a memory device, comprising:

forwarding a strobe signal, wherein the strobe signal is not forwarded until after a predetermined time interval following a read command to the memory device;

capturing a first bit value, according to the forwarded strobe signal, in a data signal from the memory device;

delaying the forwarded strobe signal so that the bit value is captured according to the delayed forwarded strobe signal; and no longer forwarding the strobe signal after detecting that the delayed forwarded strobe signal has been deasserted.

28. The method of claim 27 further comprising:

transmitting a reference pulse from a controller to the memory device and back to the controller, and measuring a value that includes the roundtrip flight time interval of the pulse, wherein the predetermined time interval is at least as long as the roundtrip time interval.

29. The method of claim 28 wherein the predetermined time interval is at least as long as the roundtrip time interval plus a memory read latency interval of the memory device.

30. The method of claim 29 wherein the memory read latency interval is at least as long as a substantial portion of a preamble time interval, wherein the strobe signal is (1) deasserted during each preamble time interval that immediately precedes each asserted pulse in the strobe signal, and (2) neither asserted or deasserted prior to each preamble time interval in the strobe signal.

* * * * *